(12) United States Patent
Mosalikanti et al.

(10) Patent No.: US 8,350,610 B2
(45) Date of Patent: Jan. 8, 2013

(54) METHOD AND APPARATUS FOR FAST WAKE-UP OF ANALOG BIASES

(75) Inventors: Praveen Mosalikanti, Portland, OR (US); Harishankar Sridharan, Folsom, CA (US); Jacob Schneider, Austin, TX (US); Pushkar Gorur, Bangalore (IN); Nasser A. Kurd, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 12/840,691

(22) Filed: Jul. 21, 2010

(65) Prior Publication Data

US 2012/0019285 A1 Jan. 26, 2012

(51) Int. Cl.
*H03K 3/02* (2006.01)
(52) U.S. Cl. ......... 327/198; 327/143; 327/535; 327/73
(58) Field of Classification Search ............ 327/143, 327/198
See application file for complete search history.

(56) References Cited

U.S. PATENT DOCUMENTS

| | | | |
|---|---|---|---|
| 5,892,381 A | 4/1999 | Koifman et al. | |
| 5,914,681 A | 6/1999 | Rundel | |
| 6,081,558 A * | 6/2000 | North | 375/316 |
| 6,229,352 B1 * | 5/2001 | Chevallier et al. | 327/77 |
| 6,392,450 B2 * | 5/2002 | Yoshida et al. | 327/72 |
| 6,459,306 B1 * | 10/2002 | Fischer et al. | 327/67 |
| 7,184,799 B1 | 2/2007 | Jin | |
| 7,932,641 B2 * | 4/2011 | Hunter et al. | 307/86 |
| 2004/0212421 A1 | 10/2004 | Naka et al. | |
| 2009/0085618 A1 * | 4/2009 | Schneider et al. | 327/143 |
| 2009/0085623 A1 | 4/2009 | Schneider et al. | |

OTHER PUBLICATIONS

Notice to Make Rectification mailed Nov. 17, 2011 for Chinese Patent Application No. 2011 20259622.8.
International Search Report & Written Opinion mailed Feb. 17, 2012 for International Application No. PCT/US2011/043514.

* cited by examiner

*Primary Examiner* — Ryan Jager
(74) *Attorney, Agent, or Firm* — Blakely, Sokoloff, Taylor & Zafman LLP (57) ABSTRACT

Described herein is a method and apparatus to wake-up analog bias signals with minimum delay. The apparatus comprises a first logic unit operable to adjust a signal level of a gated bias signal via a first predetermined signal in response to a power-down event; a comparator operable to compare the gated bias signal with an un-gated bias signal, and operable to generate an output signal indicating the comparison result; and a self-timed logic unit coupled to the comparator and operable to generate a wake-up signal in response to an end of the power-down event and the output signal.

17 Claims, 6 Drawing Sheets

Fig. 6

METHOD AND APPARATUS FOR FAST WAKE-UP OF ANALOG BIASES

FIELD OF THE INVENTION

Embodiments of the invention relate generally to the field of processors. More particularly, embodiments of the invention relate to a method and an apparatus for improving the speed of waking up of analog bias signals.

BACKGROUND

As power consumption of a processor is becoming an important aspect of processor performance, inactive circuits in the processor are turned off to save power consumption of the processor. Inactive digital circuits can be easily turned off by setting the signals to the transistor gates of such circuits to levels that cause the transistors of the digital circuits to be off. These digital circuits can be quickly turned on by simply setting the signals to the transistors gates of such circuits to levels above the transistor threshold voltage levels.

Conversely, analog circuits are generally turned off when such analog circuits are not required to wake-up or be in an operational state quickly. Turning on an analog circuit is a long process because analog bias signals of an analog circuit take a longer time to setup to their designed bias levels compared to turning on a digital circuit. For example, digital circuits can wake-up from an inactive state (e.g., power-down state) to an active state (e.g., power-up state) in a matter of picoseconds or less, while analog circuits may take several hundred nanoseconds to wake-up from an inactive state (e.g., power-down state) to an active state (e.g., power-up state). Longer wake-up time of analog bias signals compared to digital signals may reduce overall processor performance despite the power savings realized from turning off the analog circuit when the analog circuit is inactive.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments of the invention relate to a method and apparatus for fast wake-up of analog bias signals from an inactive state (e.g., power-down state) to an active state (e.g., power-up state).

In one embodiment, a node having a gated analog bias signal is shorted to a node having an un-gated analog bias signal during normal operation of an analog circuit that receives the gated analog bias signal. In one embodiment, during a power-down event, when the processor or the analog circuit is signaled to turn off (e.g., inactive state) or operate at a lower power consumption state, the gated analog bias signal is no longer shorted to the un-gated analog bias signal. In such an embodiment, the gated analog bias signal is parked to a first predetermined signal level to cause the analog circuit receiving the gated analog bias signal to turn off.

The term park herein refers to setting a node having a signal to another signal level. For example, the node having the gated analog bias signal is parked (i.e., set) to a first predetermined signal level and/or the second predetermined signal level.

In one embodiment, upon the end of the power-down event, when the processor or the analog circuit is signaled to turn on (e.g., active state) and operate normally, the gated analog bias signal is pulled-up or pulled-down to a second predetermined signal. In such an embodiment, when the gated analog bias signal is brought close to the level of the un-gated analog bias signal, the node having the gated analog bias signal is shorted to the node having the un-gated analog bias signal.

The above embodiments allow the gated analog bias signal to wake-up to a level of the un-gated analog bias signal in a quick manner resulting in quickly turning on the analog circuit receiving the gated bias signal. For example, the analog circuits wake-up in less than 10 ns via the embodiments discussed herein compared to several microseconds without such embodiments for fast wake-up of analog circuits. Details of the above embodiments are described below with reference to FIGS. 1-6.

In the following description, the terms gated analog bias signals and un-gated analog bias signals are simply mentioned as gated bias signals and un-gated bias signals. The un-gated bias signal is generated by a reference generator e.g., band-gap circuit, resistor divider, current mirror, etc.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction any may be implemented with any suitable type of signal scheme, e.g., differential pair, single-ended, etc.

Figure 1:
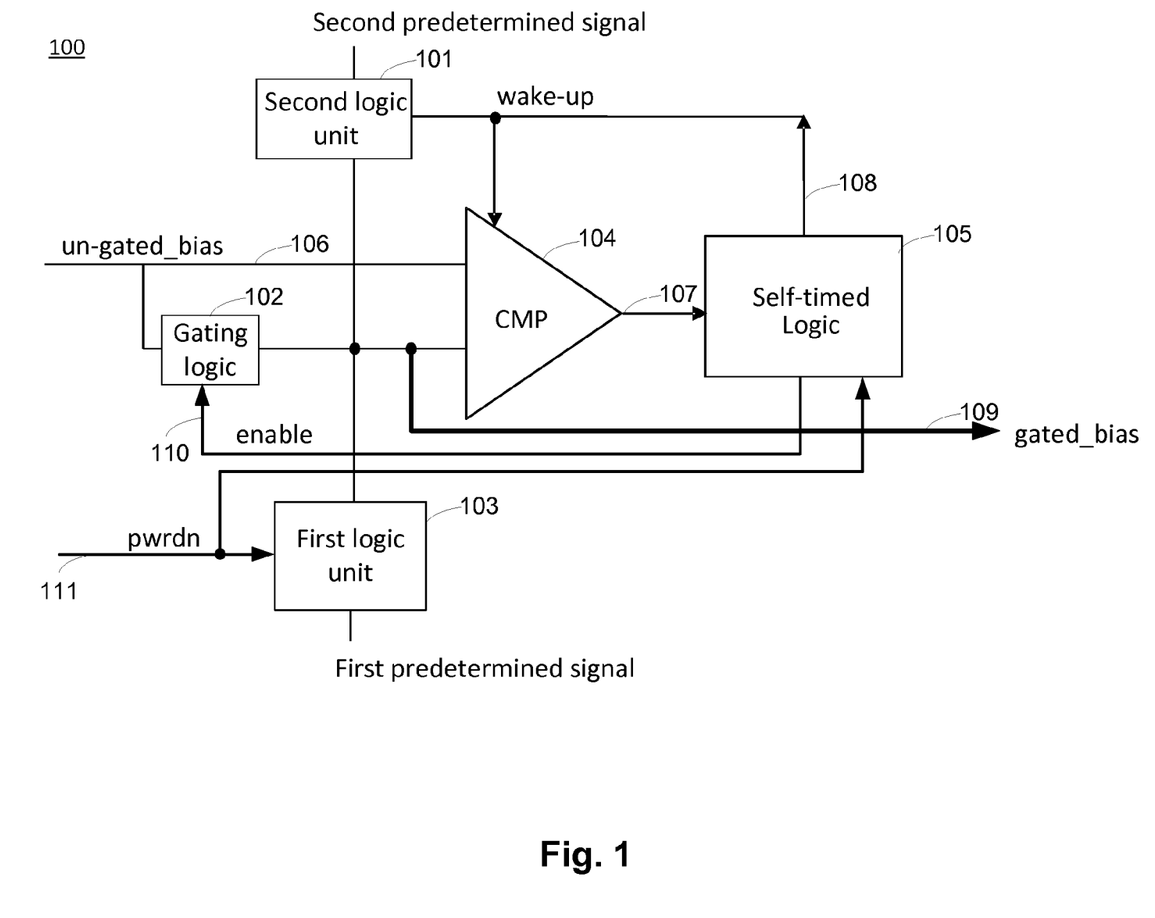
FIG. 1 illustrates a block level apparatus to wake-up a gated analog bias signal, according to one embodiment of the invention.

FIG. 1 illustrates a block level apparatus 100 to wake-up a gated bias signal 109, according to one embodiment of the invention. In one embodiment, the apparatus 100 comprises a gating logic unit 102 operable to short the node having the gated bias signal 109 to the node having an un-gated bias signal 106 in response to an enable signal 110. In one embodiment, the gating logic unit 102 comprises a pass-gate transistor. In one embodiment, the gated bias signal 109 and the un-gated bias signal 106 are input to a comparator 104. In one embodiment, the comparator 104 is operable to generate an output signal 107 based on the comparison of the gated bias signal 109 with the un-gated bias signal 106. The output signal 107 transitions from logical low level to logical high level or vise versa when the signal levels of the gated bias signal 109 and the un-gated bias signal 106 cross one another or are of levels which are substantially similar to one another.

The term substantially similar or the term close herein means that two signals are within 10% of one another in terms of signal levels. In some embodiments, the two signals can be greater than 10% of another but less than 25% of one another and still be considered substantially similar and/or close to one another.

In one embodiment, the output signal 107 from the comparator 104 transitions from a low level signal to a high level signal when the gated bias signal 109 is higher than the un-gated bias signal 106. In another embodiment, the output signal 107 may transition differently to show that the levels of the gated bias signal 109 and the un-gated bias signal 106 cross each other in the time domain. In one embodiment, the comparator 104 is a single stage differential amplifier. In other embodiments, the comparator 104 comprises multiple stage amplifiers.

In one embodiment, the gated bias signal 109 is parked (i.e., set) to a first predetermined signal via a first logic unit 103. In one embodiment, the first logic unit 103 is operable to receive a power-down signal 111 indicating a power-down event and then park the gated bias signal 109 to the first predetermined signal level. The power-down event refers to a state in which the processor turns off power to most of its circuits to save power-consumption. The power-down state is also referred to herein as an inactive state.

In one embodiment, the first predetermined signal level is set to a low voltage supply level (VSS). In another embodiment, the first predetermined signal level is set to a level substantially similar to the level of the un-gated bias signal 106. In such an embodiment, the gated bias signal 109 can be raised or lowered in a short period of time to get close (i.e., substantially similar) to the un-gated bias signal 106 level at the end of the power-down event because the gated bias signal 109 does not have to be raised from VSS level all the way to the un-gated bias signal 106 level. As mentioned above, the term substantially similar herein means that the two signals (i.e., the gated bias signal and the un-gated bias signal) are within 10% of one another in terms of signal levels.

In one embodiment, the output signal 107 and the power-down signal 111 are input to a self-timed logic unit 105. In one embodiment, the self-timed logic unit 105 is operable to generate a wake-up signal 108 to wake-up the gated bias signal 109 after an end of the power-down event (indicated by the power-down signal 111). In one embodiment, the self-timed logic unit 105 is also operable to generate the enable signal 110 to short the node having the gated bias signal 109 with the node having the un-gated bias signal 106.

In one embodiment, the wake-up signal 108 is received by a second logic unit 101 and the comparator 104. In one embodiment, the wake-up signal 108 causes the second logic unit to adjust the signal level of the gated bias signal 109 via a second predetermined signal. In one embodiment, the second predetermined signal is set to a high voltage supply level (VDD). In another embodiment, the second predetermined signal is set to a level substantially similar to the level of the un-gated bias signal. In such an embodiment, the gate bias signal can be raised or lowered in a short period of time to get close (i.e., substantially similar) to the un-gated bias signal 106 level at the end of the power-down event because the gated bias signal 109 does not have to be lowered from VDD level all the way to the un-gated bias signal 106 level.

In one embodiment, the wake-up signal 108 turns off the comparator 104 after the self-timed logic 105 determines that the output signal 107 indicates that the gated bias signal 109 is substantially similar to the un-gated bias signal 106. By turning off the power to the comparator 104, additional power consumption caused by the apparatus 100 is reduced.

Figure 2A:
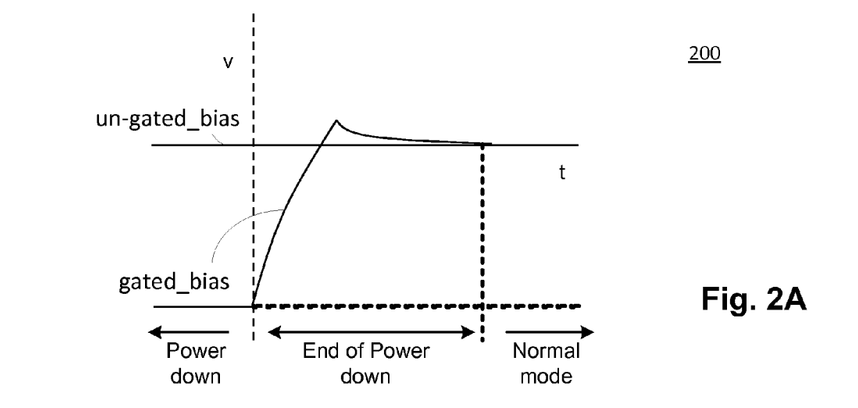
FIG. 2A is a waveform showing gated analog bias signal with a voltage level being raised to match the voltage level of an un-gated analog bias signal via the block level apparatus, according to one embodiment of the invention.

FIG. 2A is a waveform 200 showing the gated bias signal 109 with a voltage level being raised to match the voltage level of the un-gated bias signal 106 via the apparatus 100 of FIG. 1, according to one embodiment of the invention. In this embodiment, the gated bias signal 109 is parked to the first predetermined signal level by the first logic unit 103 during the power-down event. In such an embodiment, the first predetermined signal level is VSS or a level substantially similar to the level of the un-gated bias signal 106.

In one embodiment, when the power-down event ends, the first logic unit 103 is turned off and is no longer operable to adjust the signal level of the gated bias signal 109 via the first predetermined signal level. In this embodiment, at the end of the power-down event, the gated bias signal 109 is raised by the second logic unit 101 to the second predetermined signal level. When the gated bias signal 109 reaches a level which is substantially similar to the level of the un-gated bias signal 106, the self-timed logic unit 105 causes the gating logic unit 102 to short the node having the gated bias signal 109 to the node having the un-gated bias signal 106. In the above embodiment, the second predetermined signal level is above the first predetermined signal level. After the node having the gated bias signal 109 is shorted to the node having the un-gated bias signal 106, the analog circuits (See, 503-506 of FIG. 5) are operational in normal mode.

Figure 2B:
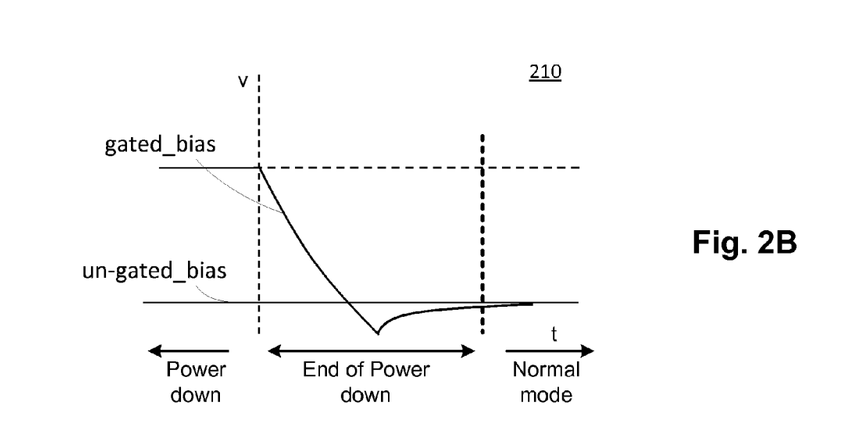
FIG. 2B is a waveform showing a gated analog bias signal with a voltage level being lowered to match the voltage level of an un-gated analog bias signal via the block level apparatus, according to one embodiment of the invention.

FIG. 2B is a waveform 210 showing the gated bias signal 109 with a voltage level being lowered to match the voltage level of the un-gated bias signal 106 via the apparatus 100, according to one embodiment of the invention. In this embodiment, the node having the gated bias signal 109 is parked (i.e., set) to the first predetermined signal level by the first logic unit 103 during the power-down event. In such an embodiment, the first predetermined signal level is VDD or a level substantially similar to the level of the un-gated bias signal 106.

In one embodiment, when the power-down event ends, the first logic unit 103 is turned off and is no longer operable to adjust the signal level of the gated bias signal 109 via the first predetermined signal level. In this embodiment, at the end of the power-down event, the gated bias signal 109 is lowered by the second logic unit 101 to the second predetermined signal level. When the gated bias signal 109 reaches a level which is substantially similar to the level of the un-gated bias signal 106, the self-timed logic unit 105 causes the gating logic unit 102 to short the node having the gated bias signal 109 to the node having the un-gated bias signal 106. In the above embodiment, the second predetermined signal level is below the first predetermined signal level. The analog circuits (See, 503-506 of FIG. 5) are operational in normal mode when the node having the gated bias signal 109 is shorted to the node having the un-gated bias signal 106.

Figure 3:
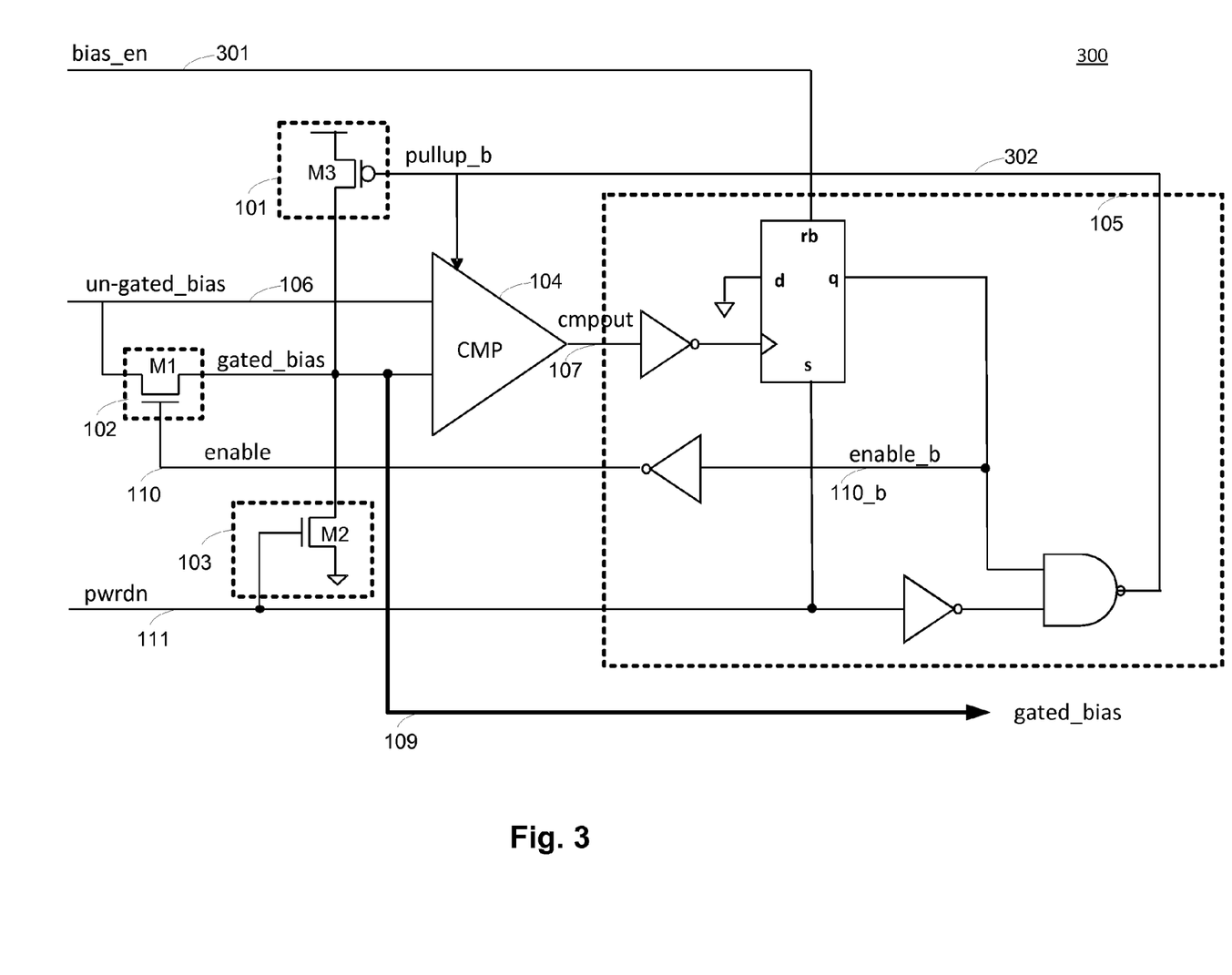
FIG. 3 illustrates a detailed view of the block level apparatus to wake-up the gated analog bias signal, according to one embodiment of the invention.

FIG. 3 illustrates a detailed apparatus 300 of the apparatus 100 to wake-up the gated bias signal 109, according to one embodiment of the invention. The apparatus 300 illustrates logic level details of the self-timed logic unit 105, according to one embodiment of the invention. In one embodiment, the self-timed logic unit 105 is operable to receive a bias enable signal 301 to setup initial conditions for the wake-up circuit 300. In such an embodiment, the bias enable signal 301 resets the self-timed logic unit 105 to short the node having the gated bias signal 109 to the node having the un-gated bias signal 106. In one embodiment, the bias enable signal 301 is the processor reset signal.

In one embodiment, the first logic unit 103 comprises a pull-down pass-gate transistor M2 which is operable to be turned off and turned on based on the power-down signal 111. The first logic unit 103 parks (i.e., sets) the node having the gated bias signal to the first predetermined signal level. In the embodiment of FIG. 3, the first predetermined signal is VSS. As discussed above, in other embodiments, the first predetermined signal is set to signal levels other than VSS.

In one embodiment, the gating logic unit 102 comprises a pass-gate transistor M1 which is operable via the enable signal 110 to short the node having the gated bias signal 109 to the node having the un-gated bias signal 106. In one embodiment, the second logic unit 101 comprises a pull-up pass-gate transistor M3 which is operable via the pullup_b signal 302 to supply VDD to the gated bias signal 109. In this embodiment, the second predetermined signal is set to VDD. As discussed above, in other embodiments, the second predetermined signal may be set to signal levels other than VDD. The operation of the wake-up circuit 300 is discussed in detail with reference to FIG. 4.

Figure 4:
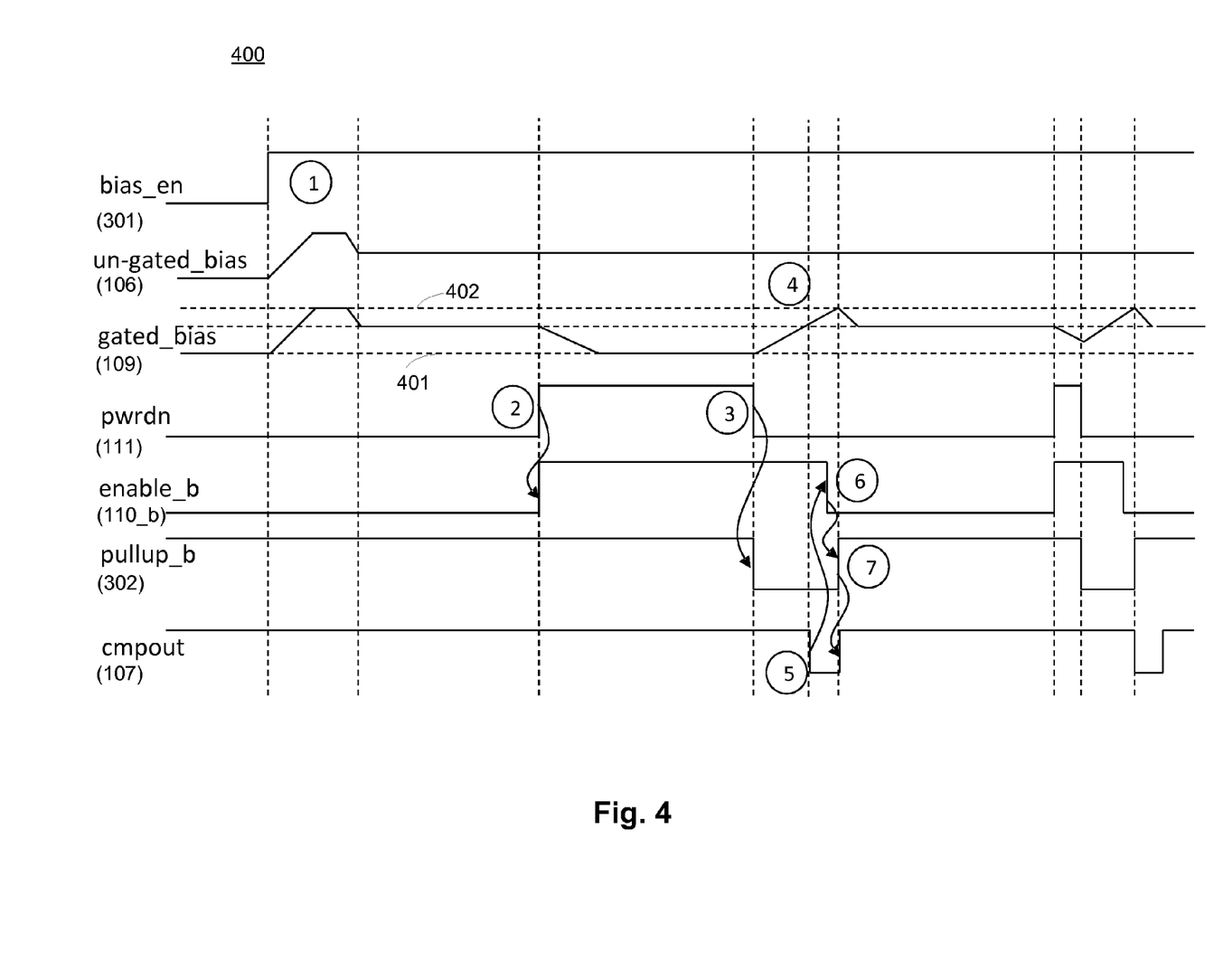
FIG. 4 is a timing diagram of the signals of the detailed view of the block level apparatus, according to one embodiment of the invention.

FIG. 4 is a timing diagram 400 of the signals associated with the apparatus 300 of FIG. 3, according to one embodiment of the invention. The reference numbers 1-7 illustrate the sequence of events in time associated with signals of the apparatus of FIG. 3, according to one embodiment of the invention. The embodiments of the invention are not limited to the above sequence of events. Other embodiments which achieve the same purpose of waking up bias signals in a fast manner may use similar signals listed in FIG. 4 to operate in a sequence different from the one discussed below.

In one embodiment, at reference number 1 the bias enable signal 301 transitions from a logical low value to a logical high value causing the apparatus 300 of FIG. 3 to initialize. The initialization process causes the enable signal 110 (shown as an inverted signal 110_b) to cause the node having the gated bias signal 109 to short with the node having the un-gated bias signal 106. During that time, the pullup_b signal 302 is set to a logical high value causing the second logic unit 101 to turn off. The shorting of the node having the gated bias signal 109 to the node having the un-gated bias signal 106 results in both signals to be identical or substantially similar to one another (i.e., within 10% of one another).

In one embodiment, at reference number 2 the power-down event begins which is shown by the transition of the power-down signal 111 from a logical low level to a logical high level. The transition of the power-down signal 111 causes the self-timed logic unit 105 to turn off the gating logic unit 102 via the enable signal 110. The pull-down signal 111 also causes the first logic unit 103 to park the node having the gated bias signal 109 to the first predetermined signal level 401.

In one embodiment, at reference number 3 the power-down event ends which is shown by the transition of the power-down signal 111. The end of the power-down event causes the self-timed logic unit 105 to adjust the signal level of the gated bias signal 109 via the second predetermined signal level by the second logic unit 101.

In one embodiment, at reference 4 the level of the gated bias signal 109 is raised by the second predetermined signal 402 till the gated bias signal 109 reaches a level substantially similar (i.e., within 10%) to the level of the un-gated bias signal 106.

In one embodiment, at reference 5 the comparator 104 generates an output signal 107 that indicates that the gated bias signal 109 is substantially similar to the un-gated bias signal 106. In one embodiment, at reference 6 the output signal 107 causes the self-timed logic unit 105 to enable (i.e., turn on) the gating logic unit 102 via the enable signal 110. The enabled gating logic unit 102 causes the node having the gated bias signal 109 to short to the node having the un-gated bias signal 106.

In one embodiment, at reference 7 the self-timed logic unit 105 updates the wake-up signal (pullup_b 302) which in turn causes the second logic unit 101 to turn off. At that time, the comparator 104 is also turned off to save power consumption. The gated bias signal 109 then causes the down-stream analog circuits (See, 503-506 of FIG. 5) to wake-up and operate normally.

Figure 5:
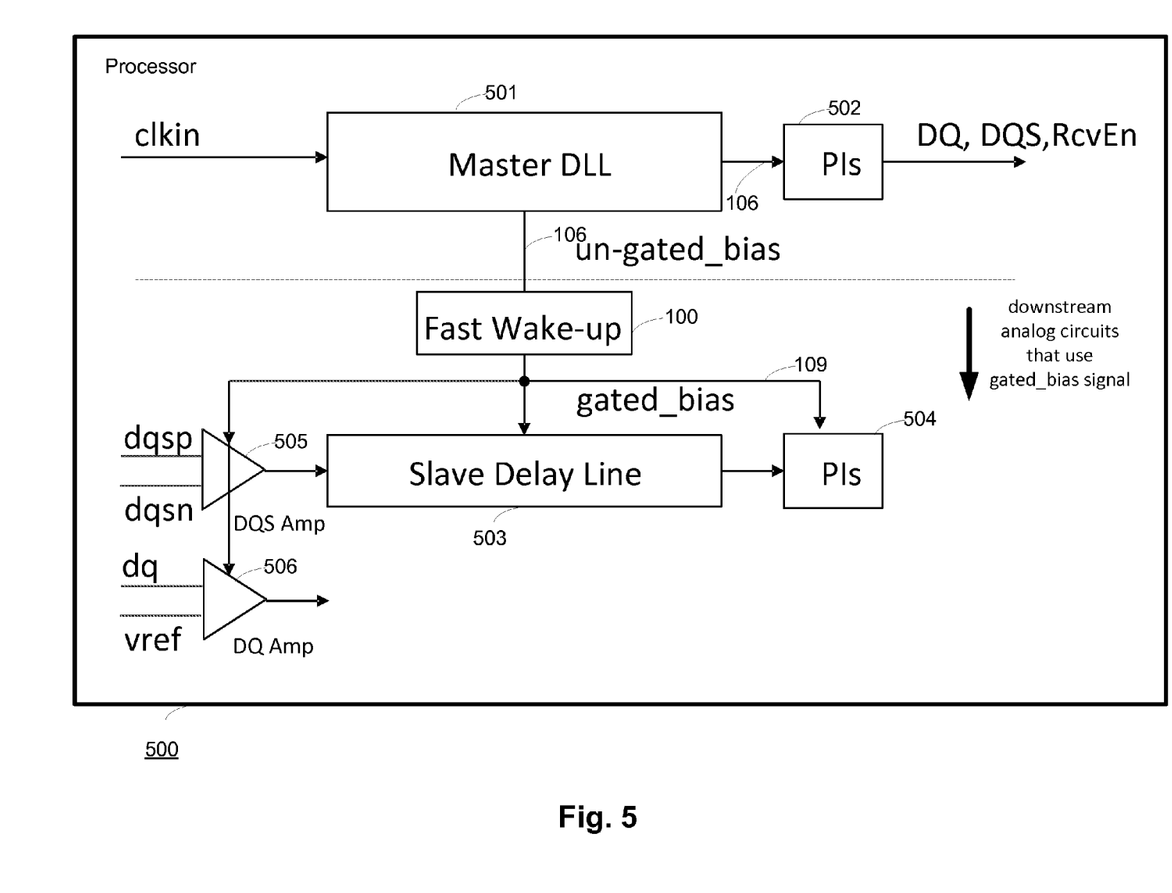
FIG. 5 is a processor with the apparatus for fast wake-up of the gated analog bias signal, according to one embodiment of the invention.

FIG. 5 is a processor 500 with the apparatus 100 (fast wake-up unit) for fast wake-up of the gated bias signal 109, according to one embodiment of the invention. In this embodiment, the master delay locked loop (DLL) is the primary circuit 501 for generating the un-gated bias signal 106. While the embodiment discusses a master DLL as the primary circuit 501, other bias generators may be used to generate the un-gated bias signal 106.

In one embodiment, the un-gated bias signal 106 is supplied to the analog circuits 502-506. In one embodiment, the analog circuit 502 is a phase interpolator which cannot be turned off when the processor 500 goes in a power-down state. This is because certain analog circuits need to remain operational even when the processor 500 goes in the power-down state (inactive state) so that the processor can wake-up properly and function without any issues related to power-down of the processor.

In one embodiment, the fast wake-up unit 100 is operable to generate the gated bias signal 109 for the down-stream analog circuits 503-506 which include a slave delay line, phase interpolators, and amplifiers. These down-stream analog circuits are operable to turn off when the processor 500 goes in the power-down state. However, when the processor wakes up from the power-down state, the fast wake-up circuit 100 is operable to provide the gated bias signal 109 of a level which is substantially the same as the un-gated bias signal level 106. In one embodiment, the fast wake-up circuit 100 is operable to provide a gated bias signal 109 of a level which is substantially the same as the level of the un-gated bias signal 106 within a time period of 1 ns.

Figure 6:
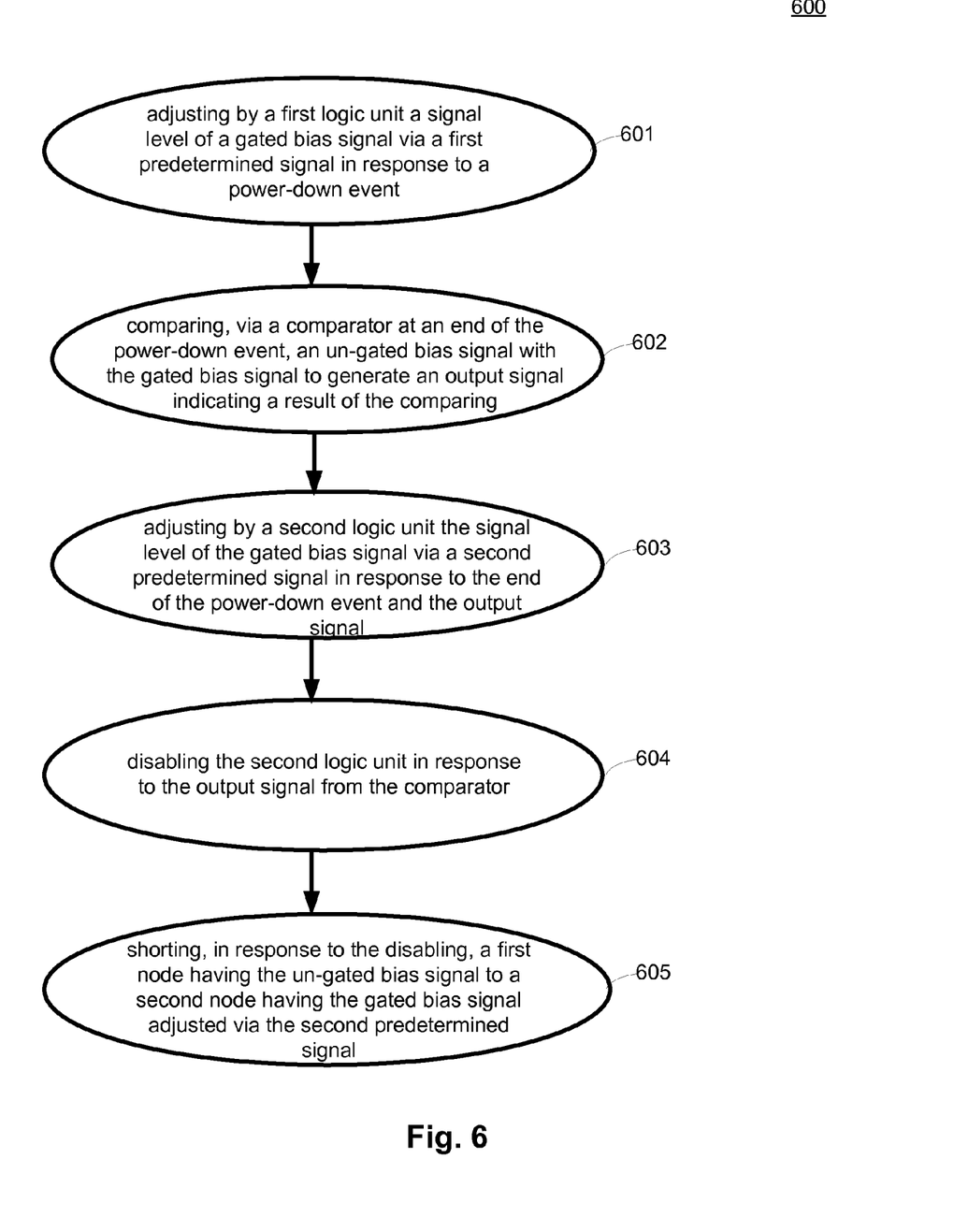
FIG. 6 is a flowchart of a method for fast wake-up of an analog bias signal, according to one embodiment of the invention.

FIG. 6 is a flowchart 600 of a method for fast wake-up of an analog bias signal, according to one embodiment of the invention. The flowchart 600 is described with reference to FIGS. 1-5. At block 601, the first logic unit 103 adjusts a signal level of a gated bias signal 109 via a first predetermined signal 401 in response to a power-down event. At block 602, the comparator 104 compares at an end of the power-down event, an un-gated bias signal 106 with the gated bias signal 109 to generate an output signal 107 indicating a result of the comparing. At block 603, the second logic unit 101 adjusts the signal level of the gated bias signal 109 via a second predetermined signal 402 in response to the end of the power-down event and the output signal 107.

At block 604, the self-timed logic unit 105 disables the second logic unit 101 in response to the output signal 107 from the comparator 104. At block 605, the self-timed logic unit 105 causes the gating logic unit 102 to short the node having the un-gated bias signal 106 to the node having the gated bias signal 109 adjusted by the second predetermined signal in response to the disabling, wherein shorting the node having the un-gated bias signal 106 to the node having the gated bias signal 109 is in response to the transition of the output signal 107 from the comparator 104 indicating the gated bias signal 109 supplied by the second predetermined signal 402 is substantially equal to the un-gated bias signal 106.

Elements of embodiments are also provided as a machine-readable storage medium for storing the computer-executable instructions. For example, the method of generating the gated bias signal after power-down event ends as discussed in FIG. 6 is programmable via computer-executable instructions stored on the machine-readable medium. In one embodiment, the machine-readable storage medium may include, but is not limited to, flash memory, optical disks, CD-ROMs, DVD ROMs, RAMs, EPROMs, EEPROMs, magnetic or optical cards, or other type of machine-readable storage media suitable for storing electronic or computer-executable instructions. For example, embodiments of the invention may be downloaded as a computer program which may be transferred from a remote computer (e.g., a server) to a requesting computer (e.g., a client) by way of data signals via a communication link (e.g., a modem or network connection).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. For example, the self-timed logic unit 105 may be implemented with fewer or more logic gates than shown in FIG. 3 to achieve the function of the method discussed in FIGS. 5-6. Similarly, the pass-gates M1-M3 in FIG. 3 may be replaced with PMOS based pass-gates or a combination of NMOS and PMOS based pass-gates.

In one embodiment, a delayed power-down signal 111 is input to the first logic unit 103 to provide enough time for the self-timed logic unit 105 to generate the enable signal 110 to turn off the gating logic unit 102. The term enough time refers to a time delay which is long enough to turn off the gating logic unit 102 before the first logic unit 103 is turned on to park (i.e., set) the node having the gated bias signal 109 to the first predetermined signal level. In an alternative embodiment, the self-timed logic unit 105 is operable to generate a delayed version of the power-down signal 111 to cause the enable signal 110 to arrive before the power-down signal 111 turns on the first logic unit 103.

Likewise, in one embodiment, the gated bias signal is generated using the un-gated bias signal via a unity gain operational amplifier (OPAMP) instead of the gating logic unit. The unity gain OPAMP is operable to receive the un-gated bias signal and the gated bias signal as inputs wherein the gated bias signal is the output of the OPAMP. In such an embodiment, the unity gain OPAMP is disabled during power-down event and the node having the gated bias signal is parked (i.e., set) by the first logic unit 103 to the first predetermined signal 401. During power-up, the unity gain OPAMP is turned on. Generally, unity gain OPMAPs wake-up in several microseconds. In one embodiment, to overcome the slow wake-up of the unity gain OPAMP, the node having the gated bias signal is shorted to the node having the un-gated bias signal via a pass-gate transistor till the OPAMP completely wakes up. In such an embodiment, the down-stream analog circuits 503-506 may begin to operate via the node having the shorted gated bias signal till the OPMAP completely wakes up to provide a more accurate gated bias signal.

The embodiments of the invention are intended to embrace all such alternatives, modifications, and variations as to fall within the broad scope of the appended claims.

We claim:

1. An apparatus comprising:
    a first logic unit operable to adjust a signal level of a gated bias signal via a first predetermined signal in response to a power-down event;
    a comparator operable to compare the gated bias signal with an un-gated bias signal, and operable to generate an output signal indicating the comparison result;
    a self-timed logic unit coupled to the comparator and operable to generate a wake-up signal in response to an end of the power-down event and the output signal; and
    a second logic unit operable to adjust the signal level of the gated bias signal via a second predetermined signal in response to the wake-up signal.

2. The apparatus of claim 1, wherein the self-timed logic unit is operable to turn off the second logic unit after the end of the power-down event and in response to the output signal indicating the gated bias signal is substantially equal to the un-gated bias signal.

3. The apparatus of claim 1, wherein the first predetermined signal has a first signal level substantially equal to a ground signal level, and wherein the second predetermined signal has a second signal level substantially equal to a supply signal level.

4. The apparatus of claim 1, wherein the first and the second predetermined signals have signal levels substantially equal to a signal level of the un-gated bias signal.

5. The apparatus of claim 1 further comprising a gating logic unit coupled to the comparator and operable to short a first node having the un-gated bias signal to a second node having the gated bias signal at the end of the power-down event via the self-timed logic unit.

6. The apparatus of claim 5, wherein the self-timed logic unit is operable to turn off the gating logic unit in response to the power-down event and the output signal from the comparator.

7. The apparatus of claim 1, wherein the self-timed logic unit is operable to turn off the comparator in response to the output signal indicating the gated bias signal is substantially equal to the un-gated bias signal.

8. The apparatus of claim 1, wherein the first logic unit comprises a pass-gate transistor operable to receive a signal indicating the power-down event, and wherein the first logic unit is operable to turn off via a signal indicating the end of the power-down event.

9. A method comprising:
adjusting by a first logic unit a signal level of a gated bias signal via a first predetermined signal in response to a power-down event;
comparing, via a comparator at an end of the power-down event, an un-gated bias signal with the gated bias signal to generate an output signal indicating a result of the comparing;
adjusting by a second logic unit the signal level of the gated bias signal via a second predetermined signal in response to the end of the power-down event and the output signal;
disabling the second logic unit in response to the output signal from the comparator; and
shorting, in response to the disabling, a first node having the un-gated bias signal to a second node having the gated bias signal adjusted via the second predetermined signal.

10. The method of claim 9, wherein disabling the second logic unit comprises:
determining a transition of the output signal from the comparator indicating the gated bias signal adjusted by the second predetermined signal being substantially equal to the un-gated bias signal; and
turning off the comparator in response to the determining.

11. The method of claim 9, wherein shorting the first node having the un-gated bias signal to the second node having the gated bias signal is in response to the transition of the output signal from the comparator indicating the gated bias signal adjusted by the second predetermined signal is substantially equal to the un-gated bias signal.

12. The method of claim 9, wherein the first predetermined signal has a first signal level substantially equal to a ground signal level, and wherein the second predetermined signal has a second signal level substantially equal to a supply signal level.

13. A processor comprising:
a first circuit operable to generate an un-gated bias signal; and
a second circuit coupled to the first circuit and operable to generate a gated bias signal, the second circuit comprising:
a first logic unit operable to adjust a signal level of the gated bias signal via a first predetermined signal in response to a power-down event;
a comparator operable to compare the gated bias signal with the un-gated bias signal, and operable to generate an output signal indicating the comparison result;
a self-timed logic unit coupled to the comparator and operable to generate a wake-up signal in response to an end of the power-down event and the output signal; and
a second logic unit operable to adjust the signal level of the gated bias signal via a second predetermined signal in response to the wake-up signal.

14. The processor of claim 13, wherein the first predetermined signal has a first signal level substantially equal to a ground signal level, and wherein the second predetermined signal has a second signal level substantially equal to a supply signal level.

15. The processor of claim 13, wherein the second circuit further comprises a gating logic unit coupled to the comparator and operable to short a first node having the un-gated bias signal to a second node having the gated bias signal at the end of the power-down event via the self-timed logic unit.

16. The processor of claim 13, wherein the self-timed logic unit is operable to turn off the gating logic unit in response to the power-down event and the output signal from the comparator.

17. The processor for claim 13, wherein the first circuit is a master delay-locked-loop circuit, the processor further comprising a third circuit operable to receive the gated bias signal from the second circuit.

* * * * *